United States Patent
Dai et al.

(10) Patent No.: US 8,022,737 B2
(45) Date of Patent: Sep. 20, 2011

(54) ELECTRONIC DEVICE AND DELAY CIRCUIT THEREOF

(75) Inventors: Lung Dai, Taipei Hsien (TW); Yu-Wei Cao, Shenzhen (CN); Wang-Chang Duan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/684,899

(22) Filed: Jan. 9, 2010

(65) Prior Publication Data

US 2010/0176861 A1  Jul. 15, 2010

(30) Foreign Application Priority Data

Jan. 13, 2009 (CN) .......................... 2009 10 300167

(51) Int. Cl.
*H03L 7/00* (2006.01)
(52) U.S. Cl. .......................... 327/143; 327/142; 327/198
(58) Field of Classification Search .................. 327/143, 327/283, 284

See application file for complete search history.

(56) References Cited

U.S. PATENT DOCUMENTS

| 5,146,121 A | 9/1992 | Searles et al. |
| 5,324,999 A * | 6/1994 | Hunley et al. ................. 327/553 |
| 6,876,237 B2 * | 4/2005 | Lee et al. ...................... 327/143 |
| 2004/0095173 A1 | 5/2004 | Lee et al. |

FOREIGN PATENT DOCUMENTS

| EP | 1564886 A1 | 8/2005 |
| JP | 55-621 A | 1/1980 |
| JP | 2680952 B2 | 11/1997 |

* cited by examiner

*Primary Examiner* — Lincoln Donovan
*Assistant Examiner* — John Poos
(74) *Attorney, Agent, or Firm* — Altis Law Group, Inc.

(57) ABSTRACT

A delay circuit is used for receiving an input signal from a signal source. The delay circuit includes a delay unit, a switch unit, and a generator. The switch unit is used for receiving a voltage from a power supply and selectively transmitting the voltage to the delay unit according to the input signal. The generator is coupled to the power supply for generating an output signal. The output signal is equivalent to the input signal that is delayed for a predetermined time period. Wherein the delay unit is used for generating an electrical signal according to the voltage and transmitting the electrical signal to the generator. The delay unit includes an adjustable capacitor coupled between ground and an interconnection of the switch unit and the generator. An electronic device including the delay circuit is also provided.

20 Claims, 3 Drawing Sheets

ELECTRONIC DEVICE AND DELAY CIRCUIT THEREOF

BACKGROUND

1. Technical Field

The disclosed embodiments relate to delay circuits, and more particularly to a delay circuit for delaying control signals of an electronic device.

2. Description of Related Art

Generally, when an integrated circuit (IC) in an electronic device is ready to be powered on, the IC needs to be initialized. The IC always needs a delay time to stabilized to complete the initialization process. Therefore, a delay circuit is needed to delay control signals used for controlling the IC before the IC is stable.

However, the delay time for different ICs varies, thus different delay circuits are needed for each different ICs, respectively. This is inconvenient and costly.

What is needed, is a delay circuit for overcoming the above described limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
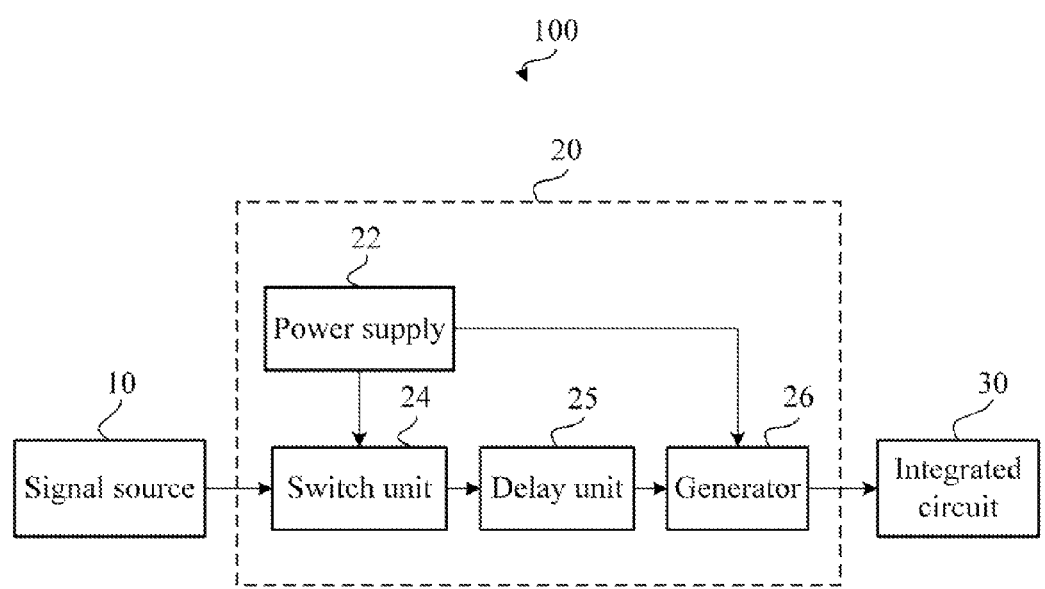
FIG. 1 is a block diagram of an electronic device in accordance with an exemplary embodiment, the electronic device includes a delay circuit.

Referring to FIG. 1, an electronic device 100 in accordance with an exemplary embodiment is illustrated. The electronic device 100 includes a signal source 10, a delay circuit 20, and an integrated circuit (IC) 30. The delay circuit 20 is used for receiving an input signal provided by a signal source 10, and supplying an output signal to the IC 30. The output signal is equivalent to the input signal delayed over a predetermined time period, the predetermined time period is adjustable. The output signal is used for controlling normal operations of the IC 30. In this embodiment, the input signal is a pulse signal.

The delay circuit 20 includes a power supply 22, a switch unit 24, a delay unit 25, and a generator 26. The power supply 22 is used for supplying a voltage to the switch unit 24 and the generator 26. The voltage is equal to a high level voltage of the input signal. The switch unit 24 is used for transmitting the voltage to the delay unit 25 according to the input signal provided by the signal source 10. The delay unit 25 is used for supplying a electrical signal to the generator 26 based on the voltage. The generator 26 is used for receiving the voltage and the electrical signal, and generating the output signal.

Figure 2:
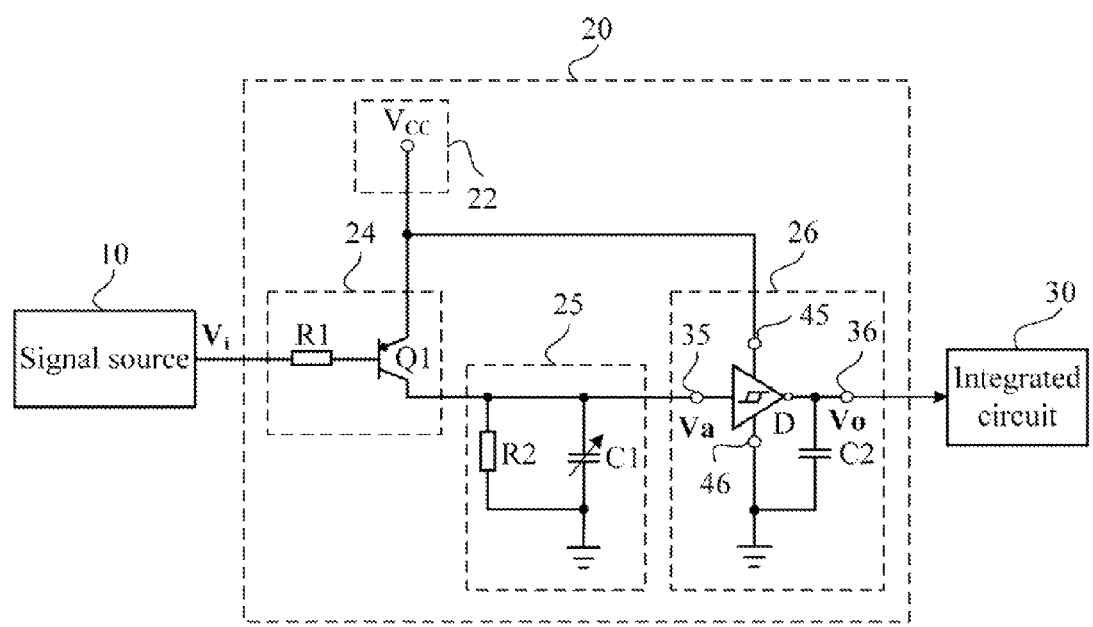
FIG. 2 is a circuit diagram of the delay circuit of FIG. 1.

Referring to FIG. 2, the switch unit 24 includes a transistor Q1 and a first resistor R1. One end of the first resistor R1 is coupled to the signal source 10, and the other end of the first resistor R1 is coupled to a base of the transistor Q1. An emitter of the transistor Q1 is coupled to the power supply 22, and a collector of the transistor Q1 is coupled to the delay unit 25. In this embodiment, the transistor Q1 is a PNP type bipolar junction transistor (BJT).

The delay unit 25 includes a second resistor R2 and an adjustable capacitor C1. One end of the second resistor R2 is coupled to the collector of the transistor Q1, the other end of the second resistor R2 is grounded. One end of the adjustable capacitor C1 is coupled between the collector of the transistor Q1 and the generator 26, the other end of the adjustable capacitor C1 is grounded. In this embodiment, the resistance of the second resistor R2 is adjustable.

The generator 26 includes a Schmitt trigger D and a filtering capacitor C2. The Schmitt trigger D includes an input terminal 35, an output terminal 36, a first terminal 45, and a second terminal 46. The first terminal 45 is coupled to the power supply 22, the second terminal 46 is grounded, the input terminal 35 is coupled to the adjustable capacitor C1, and the output terminal 36 is used for outputting the output signal. One end of the filtering capacitor C2 is coupled to the output terminal 36, the other end of the filtering capacitor C2 is grounded. The filtering capacitor C2 is used for filtering the output signal to be outputted from the generator 26.

Figure 3:
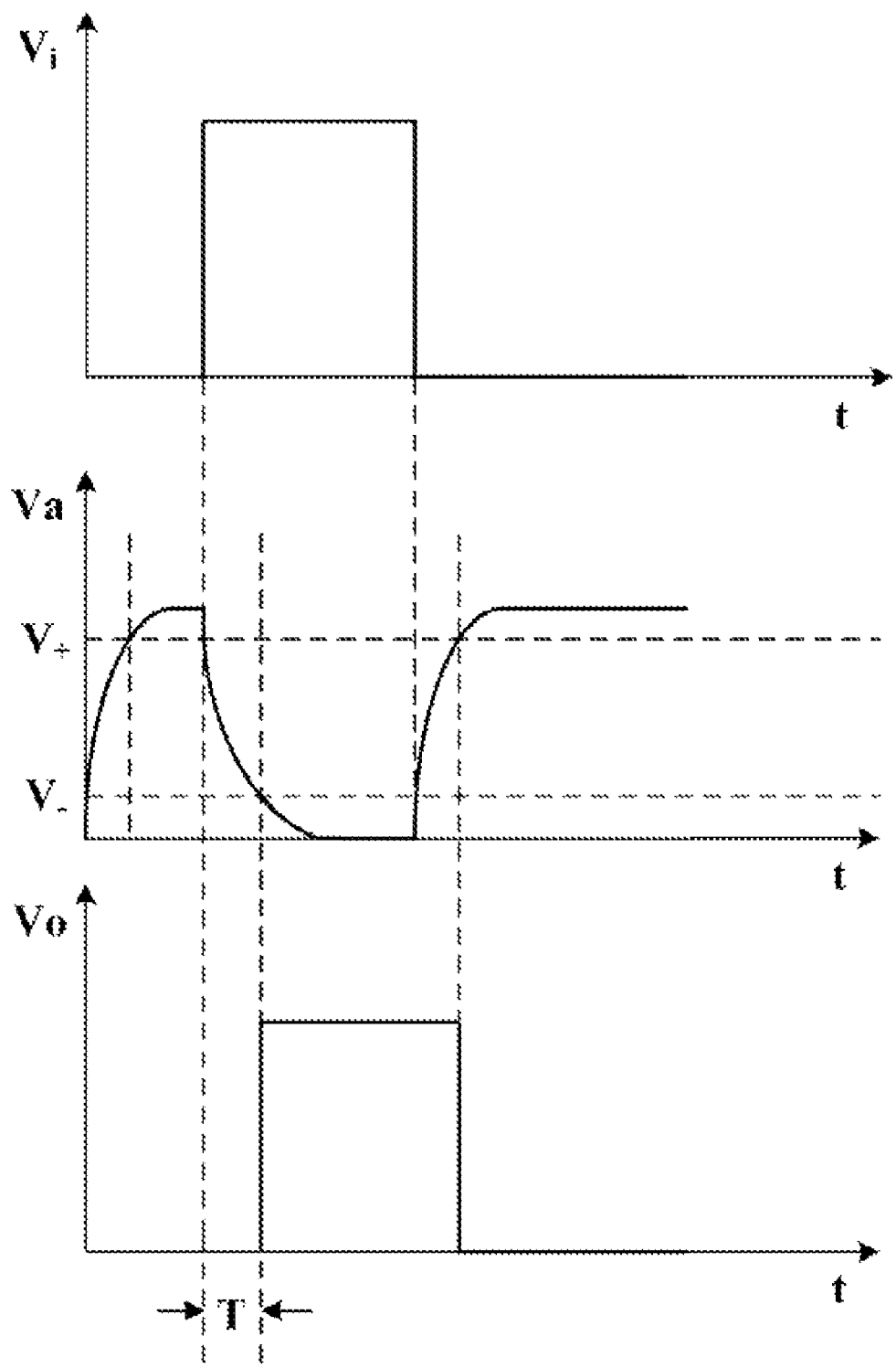
FIG. 3 illustrates waveforms of electric signals generated by the delay circuit of FIG. 1.

The Schmitt trigger D is preset with a first threshold voltage $V_+$ and a second threshold voltage $V_-$ (see FIG. 3). When the voltage at the input terminal 35 is higher than the first threshold voltage $V_+$, the output terminal 36 outputs a low level voltage. When the voltage at the input terminal 35 is lower than the second threshold voltage $V_-$, the output terminal 36 outputs a high level voltage. When the voltage at the input terminal 35 is between the first threshold voltage $V_+$ and the second threshold voltage $V_-$, the output terminal 36 retains its value.

Referring further to FIG. 3, when the input signal Vi provided by the signal source 10 is a low level voltage, the transistor Q1 turns on. The adjustable capacitor C1 becomes charged up by the voltage of the power supply 22, as a result, the voltage at the input terminal 35 rises to a high level voltage. When the voltage Va at the input terminal 35 is higher than the first threshold voltage $V_+$, the voltage Vo at the output terminal 36 is a low level voltage.

When the input signal Vi provided by the signal source 10 is changed to a high level voltage from the low level voltage, the transistor Q1 turns off. The adjustable capacitor C1 discharges through the resistor R2, a discharge time τ of the adjustable capacitor C1 is calculated by the following formula:

$$\tau = R2 * C1$$

After the discharge time τ, the input terminal 35 falls to a low level voltage. When the voltage of the input terminal 35 is lower than the second threshold voltage $V_-$, the voltage Vo of the output terminal 36 is a high level voltage. Therefore, the delay circuit 20 delays the pulses of the input signal Vi by a time interval. The time interval is shorter than the discharge time τ. Because the capacitance of the adjustable capacitor C1 and the resistance of the second resistor R2 are adjustable, thus the discharge time τ and the time interval are also adjustable, thus the circuitry can be used as a delay circuit for different ICs.

Alternative embodiments will become apparent to those skilled in the art to which the present invention pertains without departing from the spirit and scope. Accordingly, the present invention should be deemed not to be limited to the above detailed description, but rather by the claims that follow.

What is claimed is:

1. A delay circuit for receiving an input signal from a signal source, the delay circuit comprising:
   a delay unit capable of being configured in a first mode and a second mode;
   a switch unit for receiving a voltage from a power supply and selectively transmitting the voltage to the delay unit according to the input signal; and
   a generator being coupled to the power supply;
   wherein in the first mode, the input signal is in a first logic level, the switch unit is turned on according to the input signal, thus the delay unit is charged up by the voltage from the power supply to generate a first electrical signal, the generator is used for generating a first output signal according to the first electrical signal, the first output signal is equivalent to the first logic level input signal that is delayed for a first predetermined time period;
   wherein in the second mode, the input signal is in a second logic level different from the first logic level, the switch unit is cut off according to the input signal, thus the delay unit is discharged to generate a second electrical signal, the generator is used for generating a second output signal according to the second electrical signal, the second output signal is equivalent to the second logic level input signal that is delayed for a second predetermined time period.

2. The delay circuit according to claim 1, wherein the generator comprises a Schmitt trigger, the Schmitt trigger comprises an input terminal, an output terminal, a first terminal, and a second terminal, the first terminal is coupled to the power supply, the second terminal is grounded, the input terminal is coupled to the delay unit, and the output terminal is used for outputting the output signal.

3. The delay circuit according to claim 2, wherein the Schmitt trigger is preset with a first threshold voltage and a second threshold voltage, when the voltage of the input terminal is higher than the first threshold voltage, the output terminal outputs a zero level voltage, when the voltage of the input terminal is lower than the second threshold voltage, the output terminal outputs a high level voltage, when the voltage of the input terminal is between the first threshold voltage and the second threshold voltage, the output terminal retains its value.

4. The delay circuit according to claim 2, wherein the generator further comprises a filtering capacitor for filtering the output signal, the filtering capacitor is coupled between the output terminal of the Schmitt trigger and ground.

5. The delay circuit according to claim 1, wherein the switch unit comprises a transistor, a base of the transistor is coupled to the signal source, an emitter of the transistor is coupled to the power supply, and a collector of the transistor is coupled to the delay unit.

6. The delay circuit according to claim 5, wherein the switch unit further comprises a first resistor, a first end of the first resistor is coupled to the signal source, a second end of the first resistor is coupled to the base of the transistor.

7. The delay circuit according to claim 1, wherein the delay unit comprises an adjustable capacitor, the adjustable capacitor is coupled between ground and the interconnection of the switch unit and the generator.

8. The delay circuit according to claim 7, wherein the delay unit further comprises a second resistor, the second resistor is coupled between ground and the interconnection of the switch unit and the generator, the resistance of the second resistor is adjustable.

9. A delay circuit for receiving an input signal from a signal source, the delay circuit comprising:
   a delay unit;
   a switch unit for receiving a voltage from a power supply and selectively transmitting the voltage to the delay unit according to the input signal; and
   a generator being coupled to the power supply for generating an output signal, the output signal being equivalent to the input signal that is delayed for a predetermined time period;
   wherein the delay unit is used for generating an electrical signal according to the voltage and transmitting the electrical signal to the generator, the delay unit comprises an adjustable capacitor coupled between ground and an interconnection of the switch unit and the generator, the adjustable capacitor is capable of being adjusted to delay the output signal for different predetermined time period, the generator comprises a Schmitt trigger and a filtering capacitor, the Schmitt trigger comprises an input terminal, an output terminal, a first terminal, and a second terminal, the first terminal is coupled to the power supply, the second terminal is grounded, the input terminal is coupled to the adjustable capacitor, and the output terminal is used for outputting the output signal, the filtering capacitor is used for filtering the output signal, the filtering capacitor is coupled between the output terminal of the Schmitt trigger and ground.

10. The delay circuit according to claim 9, wherein the Schmitt trigger is preset with a first threshold voltage and a second threshold voltage, when the voltage of the input terminal is higher than the first threshold voltage, the output terminal outputs a zero level voltage, when the voltage of the input terminal is lower than the second threshold voltage, the output terminal outputs a high level voltage, when the voltage of the input terminal is between the first threshold voltage and the second threshold voltage, the output terminal retains its value.

11. The delay circuit according to claim 9, wherein the switch unit comprises a transistor, a base of the transistor is coupled to the signal source, an emitter of the transistor is coupled to the power supply, and a collector of the transistor is coupled to the delay unit.

12. The delay circuit according to claim 11, wherein the switch unit further comprises a first resistor, a first end of the first resistor is coupled to the signal source, a second end of the first resistor is coupled to the base of the transistor.

13. The delay circuit according to claim 9, wherein the delay unit further comprises a second resistor, the second resistor is coupled between ground and the interconnection of the switch unit and the generator, the resistance of the second resistor is adjustable.

14. An electronic device, comprising:
   a signal source for providing an input signal;
   an integrated circuit; and
   a delay circuit comprising:
   a delay unit;
   a switch unit for receiving a voltage from a power supply and selectively transmitting the voltage to the delay unit according to the input signal; and
   a generator being coupled to the power supply;
   wherein in the first mode, the input signal is in a first logic level, the switch unit is turned on according to the input signal, thus the delay unit is charged up by the voltage from the power supply to generate a first electrical signal, the generator is used for generating a first output signal according to the first electrical signal, the first output signal is equivalent to the first logic level input signal that is delayed for a first predetermined time period;

wherein in the second mode, the input signal is in a second logic level different from the first logic level, the switch unit is cut off according to the input signal, thus the delay unit is discharged to generate a second electrical signal, the generator is used for generating a second output signal according to the second electrical signal, the second output signal is equivalent to the second logic level input signal that is delayed for a second predetermined time period.

15. The electronic device according to claim 14, wherein the generator comprises a Schmitt trigger, the Schmitt trigger comprises an input terminal, an output terminal, a first terminal, and a second terminal, the first terminal is coupled to the power supply, the second terminal is grounded, the input terminal is coupled to the adjustable capacitor, and the output terminal is used for outputting the output signal.

16. The electronic device according to claim 15, wherein the Schmitt trigger is preset with a first threshold voltage and a second threshold voltage, when the voltage of the input terminal is higher than the first threshold voltage, the output terminal outputs a zero level voltage, when the voltage of the input terminal is lower than the second threshold voltage, the output terminal outputs a high level voltage, when the voltage of the input terminal is between the first threshold voltage and the second threshold voltage, the output terminal retains its value.

17. The electronic device according to claim 15, wherein the generator further comprises a filtering capacitor for filtering the output signal, the filtering capacitor is coupled between the output terminal of the Schmitt trigger and ground.

18. The electronic device according to claim 14, wherein the delay unit comprises an adjustable capacitor and a second resistor, the adjustable capacitor and the second resistor are connected in parallel between ground and the interconnection of the switch unit and the generator, the resistance of the second resistor is adjustable.

19. The delay circuit according to claim 1, wherein the first logic level is a low logic level, the second logic level is a high logic level.

20. The electronic device according to claim 14, wherein the first logic level is a low logic level, the second logic level is a high logic level.

* * * * *